United States Patent
Yokokawa et al.

(10) Patent No.: US 9,407,480 B2
(45) Date of Patent: Aug. 2, 2016

(54) ELECTRIC AND ELECTRONIC APPARATUS, CIRCUIT, AND COMMUNICATION SYSTEM

(71) Applicant: Sony Corporation, Tokyo (JP)

(72) Inventors: Takashi Yokokawa, Kanagawa (JP); Kenichi Maruko, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/626,171

(22) Filed: Feb. 19, 2015

(65) Prior Publication Data

US 2015/0256154 A1    Sep. 10, 2015

(30) Foreign Application Priority Data

Mar. 7, 2014    (JP) ................. 2014-044841

(51) Int. Cl.
| H04L 7/00 | (2006.01) |
|---|---|
| H04L 27/01 | (2006.01) |
| H04L 25/14 | (2006.01) |
| H04L 7/033 | (2006.01) |
| H03L 7/08 | (2006.01) |
| H03L 7/081 | (2006.01) |
| H03L 7/089 | (2006.01) |

(52) U.S. Cl.
CPC ............. *H04L 27/01* (2013.01); *H03L 7/081* (2013.01); *H03L 7/0805* (2013.01); *H03L 7/0807* (2013.01); *H03L 7/0898* (2013.01); *H04L 7/0008* (2013.01); *H04L 7/033* (2013.01); *H04L 25/14* (2013.01); *Y10T 307/766* (2015.04)

(58) Field of Classification Search
CPC ....... H04L 27/01; H04L 7/0008; H04L 25/14; H03K 3/011; H03K 3/012; H03K 3/013

USPC ......... 375/219, 224, 226–227, 257, 316, 346, 375/350, 354, 356–357, 371; 370/216–217
See application file for complete search history.

(56) References Cited

U.S. PATENT DOCUMENTS

| | | | | |
|---|---|---|---|---|
| 6,016,463 A * | 1/2000 | Ng | ................ | G11B 20/10009 360/53 |
| 7,054,401 B2 * | 5/2006 | Kada | ................ | H04L 25/14 375/355 |
| 7,123,660 B2 * | 10/2006 | Haq | ................ | G11C 7/1078 375/257 |
| 7,441,139 B2 * | 10/2008 | Kuwata | ................ | H04L 7/0008 375/355 |
| 8,090,971 B2 * | 1/2012 | Sarmento | ................ | H04L 7/0338 375/219 |
| 8,127,172 B2 * | 2/2012 | Kim | ................ | H03M 9/00 710/71 |
| 2002/0009169 A1 * | 1/2002 | Watanabe | ................ | H04L 25/14 375/371 |

FOREIGN PATENT DOCUMENTS

JP    2009-124737    6/2009

* cited by examiner

*Primary Examiner* — Khanh C Tran
(74) *Attorney, Agent, or Firm* — Michael Best and Friedrich LLP

(57) ABSTRACT

An apparatus according to an embodiment of the present disclosure includes a plurality of target circuits, the number of the target circuits being more than a required number of the target circuits; a characteristic adjustment unit configured to adjust characteristics of the target circuits; and a control unit configured to control a state of the target circuits between a used state and an unused state. The control unit controls the required number of the target circuits to be in the used state and controls the rest of the target circuits to be in the unused state. The characteristic adjustment unit adjusts the characteristics with respect to the target circuits in the unused state.

20 Claims, 9 Drawing Sheets

| IN0 | Effective input |
| IN1 | Effective input |
| IN2 | Effective input |
| IN3 | Effective input |

| IN_S[3:1] | 000 | 001 | 011 | 111 | 011 | 001 | 000 |
| OUT_S[3:0] | 1111 | 1110 | 1100 | 1000 | 0000 | 1000 | 1100 | 1110 | 1111 |
| Target circuits for characteristic adjustment | 11 | 12 | 13 | 14 | 15 | 14 | 13 | 12 | 11 |

FIG.2A

| IN_S[3:1] | OUT_S[3:1] | Characteristic adjustment | Normal operation |
|---|---|---|---|
| 000 | 1111 | Target circuit 11 | Target circuits 12, 13, 14, 15 |
| 00x | 1110 | Target circuit 12 | Target circuits 11, 13, 14, 15 |
| 0x1 | 1100 | Target circuit 13 | Target circuits 11, 12, 14, 15 |
| x11 | 1000 | Target circuit 14 | Target circuits 11, 12, 13, 15 |
| 111 | 0000 | Target circuit 15 | Target circuits 11, 12, 13, 14 |

FIG.2B

ELECTRIC AND ELECTRONIC APPARATUS, CIRCUIT, AND COMMUNICATION SYSTEM

CROSS REFERENCE TO RELATED APPLICATIONS

This application claims the benefit of Japanese Priority Patent Application JP2014-044841 filed Mar. 7, 2014, the entire contents of which are incorporated herein by reference.

BACKGROUND

The present disclosure relates to electric and electronic apparatuses, circuits, and communication systems.

In recent years, due to the miniaturization of MOS transistors (Metal Oxide Semiconductor Field Effect Transistors), variation of the MOS transistor characteristics has been increased, and with their power supply voltages getting lower, the operation margins have been smaller. It therefore has become difficult to achieve optimal circuit characteristics with relatively small area and low power consumption, especially in analog circuits.

Accordingly, there has been suggested a technique in which characteristic adjustment is performed immediately after the power is turned on, thereby optimizing circuit characteristics; and then operating the circuit; in order to address the problem of the variation of the circuit characteristics and achieve optimal circuit characteristics with relatively small area and low power consumption (see, for example, Japanese Patent Application Laid-open No. 2009-124737).

SUMMARY

However, there are some circuits to which the characteristic adjustment during operation is not applicable. Such circuits may have their circuit characteristics lowered due to changes in environment during operation (for example, power supply voltage fluctuation and temperature fluctuation), and in worst cases, there is a possibility of an occurrence of a malfunction. In such cases, it is desired to reduce the fluctuation of circuit characteristics due to the changes in environment during operation, or to secure the operation margins of the circuit characteristics so that the operation margins become large. However, such cases would often be accompanied by an increase in power consumption.

The present disclosure has been made in view of the above circumstances, and it is therefore desirable to provide an electric and electronic apparatus, a circuit, and a communication system which makes it possible to achieve optimal circuit characteristics with relatively small area and low power consumption.

According to an embodiment of the present disclosure, there is provided an electric and electronic apparatus including a plurality of target circuits, the number of the target circuits being more than a required number of the target circuits; a characteristic adjustment unit configured to adjust characteristics of the target circuits; and a control unit configured to control a state of the target circuits between a used state and an unused state. The control unit controls the required number of the target circuits to be in the used state and controls the rest of the target circuits to be in the unused state. The characteristic adjustment unit adjusts the characteristics with respect to the target circuits in the unused state.

According to another embodiment of the present disclosure, there is provided a circuit including a plurality of target circuits, the number of the target circuits being more than a required number of the target circuits; a characteristic adjustment unit configured to adjust characteristics of the target circuits; and a control unit configured to control a state of the target circuits between a used state and an unused state. The control unit controls the required number of the target circuits to be in the used state and controls the rest of the target circuits to be in the unused state. The characteristic adjustment unit adjusts the characteristics with respect to the target circuits in the unused state.

According to still another embodiment of the present disclosure, there is provided a communication system including a transmitting side circuit and a receiving side circuit. The receiving side circuit has a plurality of target circuits, the number of the target circuits being more than a required number of the target circuits; a characteristic adjustment unit configured to adjust characteristics of the target circuits; and a control unit configured to control a state of the target circuits between a used state and an unused state. The control unit controls the required number of the target circuits to be in the used state and controls the rest of the target circuits to be in the unused state. The characteristic adjustment unit adjusts the characteristics with respect to the target circuits in the unused state.

According to the present disclosure, it becomes possible to achieve optimal circuit characteristics with relatively small area and low power consumption. It should be noted that the effects described herein are non-limitative examples. Some embodiments of the present disclosure may also have additional effects.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 2A and 2B illustrate switching control of the circuit;

DETAILED DESCRIPTION OF EMBODIMENTS

Figure 1:
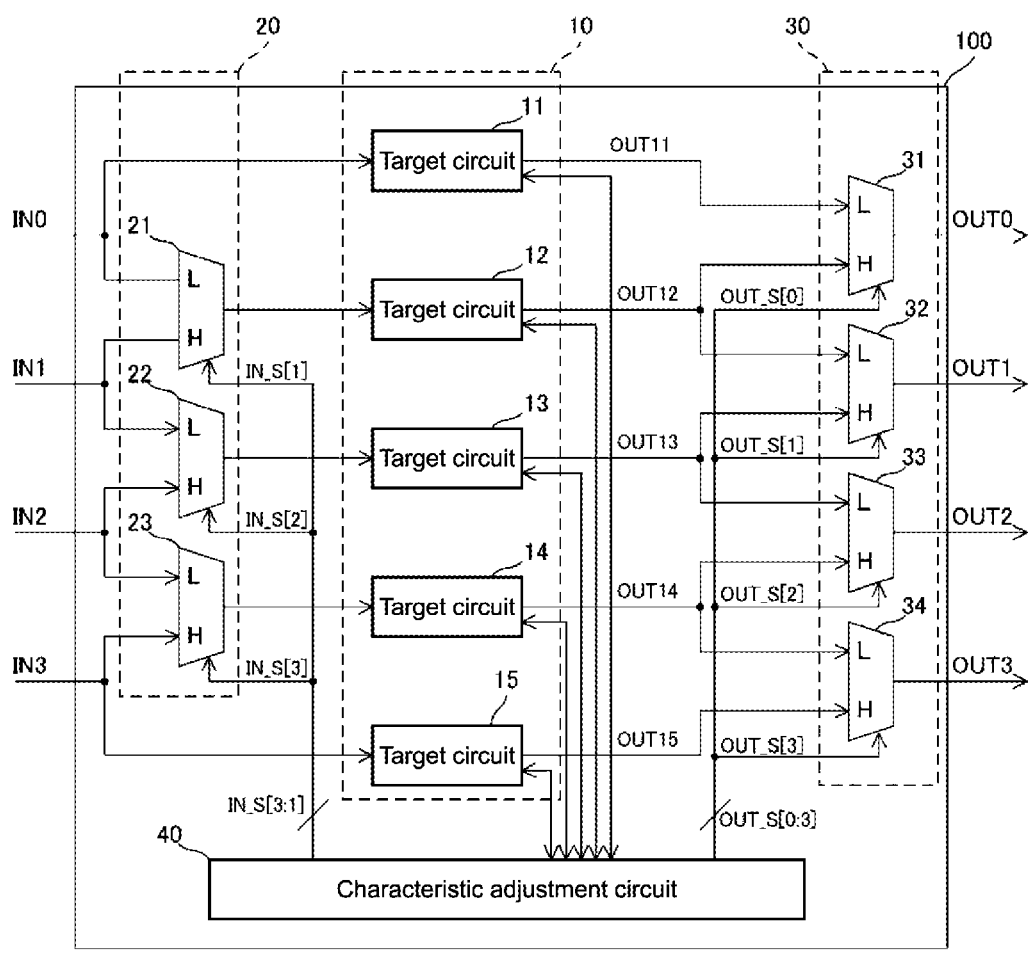
FIG. 1 is a block diagram showing a configuration of a circuit of a first embodiment of the present disclosure.

Hereinafter, the description of the present disclosure will be given in the following order.
1. First Embodiment
2. Second Embodiment
3. Third Embodiment
4. Fourth Embodiment
   1. First Embodiment FIG. 1 is a block diagram showing a configuration of a circuit of a first embodiment of the present disclosure. A circuit 100 shown in FIG. 1 has a target circuit group 10 including a plurality of target circuits 11 to 15; an input control circuit 20 which controls input to the target circuits 11 to 15; an output control circuit 30 which controls output from the target circuits 11 to 15; and a characteristic adjustment circuit 40 which adjusts characteristics of the target circuits 11 to 15. In this embodiment, the characteristic adjustment circuit 40 also functions as a control unit of the input control circuit 20 and the output control circuit 30.

The circuit 100 receives a predetermined number of input signals IN0 to IN3 and outputs a predetermined number of output signals OUT0 to OUT5. The input signals IN0 to IN3 input to the circuit 100 is input to at least one target circuit of the target circuit group 10. Each target circuit performs predetermined arithmetic processing, using the input signals, and outputs the output signals according to the input signals.

Note that the input signals input to the target circuits are not necessarily those of a single data series, but, for example, input signals of two series of data may be input. That is, for example, the input signal IN0 may be a combination of two series of data; and the target circuits, to which the input signal IN0 is input, may perform the predetermined arithmetic processing using the combination of the two series of data. Similarly, the output signals output from the target circuits may also be a combination of two series of data.

[Target Circuit Group]

The target circuit group 10 of the example shown in FIG. 1 includes the target circuits 11 to 15. The target circuits 11 to 15 have circuit configurations which are the same or compatible, and which perform predetermined arithmetic processing.

The target circuits 11 to 15 in the target circuit group 10 are made redundant. That is, the target circuit group 10 has a larger number of target circuits than a minimum number (required number) of target circuits required in the circuit 100. Accordingly, during operation of the circuit 100, at least one of the target circuits 11 to 15 of the target circuit group 10 would be in an unused state.

Note that the unused state of a target circuit means a state in which an output signal of the target circuit is not used as output of the circuit 100; and a used state of a target circuit means a state in which an output signal of the target circuit is used as output of the circuit 100.

In the example shown in FIG. 1, the circuit 100 has five target circuits 11 to 15, while the required number of the target circuits in the circuit 100 is four. The target circuit group 10 therefore has one more target circuit in addition to the required number of the target circuits.

Accordingly, when the target circuits 11 to 14 are in the used state, the target circuit 15 is in the unused state. When the target circuits 11 to 13 and 15 are in the used state, the target circuit 14 is in the unused state. When the target circuits 11, 12, 14 and 15 are in the used state, the target circuit 13 is in the unused state. When the target circuits 11 and 13 to 15 are in the used state, the target circuit 12 is in the unused state. When the target circuits 12 to 15 are in the used state, the target circuit 11 is in the unused state.

[Input Control Circuit]

The input control circuit 20 switches input destination of the input signals IN0 to IN3, which have been input to the circuit 100, to any circuit selected from the target circuits 11 to 15. At this time, same input signals may be input to different target circuits.

In the example shown in FIG. 1, the input control circuit 20 includes selectors 21 to 23 to be controlled by the characteristic adjustment circuit 40 as the control unit. Each of the selectors 21 to 23 includes a control terminal, an L input terminal, an H input terminal and an output terminal. The control terminals of the respective selectors 21 to 23 are connected to the characteristic adjustment circuit 40.

The selector 21 has the L input terminal to which the input signal IN0 is input; the H input terminal to which the input signal IN1 is input; and the output terminal connected to the target circuit 12. The selector 21 outputs one of the input signal IN0 and the input signal IN1 from the output terminal to the target circuit 12; under the control of the characteristic adjustment circuit 40.

The selector 22 has the L input terminal to which the input signal IN1 is input; the H input terminal to which the input signal IN2 is input; and the output terminal connected to the target circuit 13. The selector 22 outputs one of the input signal IN1 and the input signal IN2 from the output terminal to the target circuit 13; under the control of the characteristic adjustment circuit 40.

The selector 23 has the L input terminal to which the input signal IN2 is input; the H input terminal to which the input signal IN3 is input; and the output terminal connected to the target circuit 14. The selector 23 outputs one of the input signal IN2 and the input signal IN3 from the output terminal to the target circuit 14; under the control of the characteristic adjustment circuit 40.

Note that the input signal IN0 may be input to the target circuit 11 directly without using the selector; and the input signal IN3 may be input to the target circuit 15 directly without using the selector.

[Output Control Circuit]

The output control circuit 30 outputs four output signals as the output signals OUT0 to OUT5 of the circuit 100, the four output signals being selected from five output signals OUT11 to OUT15 which have been output by the target circuits 11 to 15.

In the example shown in FIG. 1, the output control circuit 30 includes selectors 31 to 34 to be controlled by the characteristic adjustment circuit 40 as the control unit. Each of the selectors 31 to 34 includes a control terminal, an L input terminal, an H input terminal and an output terminal. The control terminals of the respective selectors 31 to 34 are connected to the characteristic adjustment circuit 40.

The selector 31 has the L input terminal to which the output signal OUT11 from the target circuit 11 is input; and the H input terminal to which the output signal OUT12 from the target circuit 12 is input. The selector 31 outputs one of the output signal OUT11 and the output signal OUT12 from the output terminal; under the control of the characteristic adjustment circuit 40. The signal output from the output terminal would be the output signal OUT0 of the circuit 100.

The selector 32 has the L input terminal to which the output signal OUT12 from the target circuit 12 is input; and the H input terminal to which the output signal OUT13 from the target circuit 13 is input. The selector 32 outputs one of the output signal OUT12 and the output signal OUT13 from the output terminal; under the control of the characteristic adjustment circuit 40. The signal output from the output terminal would be the output signal OUT1 of the circuit 100.

The selector 33 has the L input terminal to which the output signal OUT13 from the target circuit 13 is input; and the H input terminal to which the output signal OUT14 from the target circuit 14 is input. The selector 33 outputs one of the output signal OUT13 and the output signal OUT14 from the output terminal; under the control of the characteristic adjustment circuit 40. The signal output from the output terminal would be the output signal OUT2 of the circuit 100.

The selector 34 has the L input terminal to which the output signal OUT14 from the target circuit 14 is input; and the H input terminal to which the output signal OUT15 from the target circuit 15 is input. The selector 34 outputs one of the output signal OUT14 and the output signal OUT15 from the output terminal; under the control of the characteristic adjustment circuit 40. The signal output from the output terminal would be the output signal OUT5 of the circuit 100.

[Description of Each State]

FIG. 2A is an example of timing charts of the respective signals of the circuit 100. FIG. 2B is a table showing relationship between the target circuits whose characteristics are adjusted and control signals that are input to the respective selectors. FIG. 2A shows the input signals IN0 to IN3; input-side control signal IN_S[3:1]; output-side control signal OUT_S[3:1]; and the target circuit to which the characteristic adjustment circuit 40 performs the characteristic adjustment at each timing.

In this embodiment, during operation of the circuit 100, the characteristic adjustment circuit 40 sequentially regulates the target circuits 11 to 15 to the unused state, and allows every one of the target circuits 11 to 15 to be in the unused state. That is, the characteristic adjustment is performed to every one of the target circuits 11 to 15. Accordingly, circuit characteristics of the target circuits 11 to 15 are able to be maintained within a certain desired range. This may prevent malfunction of the circuit 100, and furthermore, it may prevent malfunction of related circuits to which the output signals of the circuit 100 would be input.

In the examples shown in FIGS. 2A and 2B, the characteristic adjustment circuit 40 regulates the target circuits 11 to 15 to the unused state, in the order of: 11, 12, 13, 14, 15, 14, 13, 12, 11, . . . and adjusts the characteristics with respect to the target circuit of the unused state.

[Characteristic Adjustment of Target Circuit 11]

First, when the characteristic adjustment of the target circuit 11 is performed, the input control circuit 20 is controlled in such a manner that the input signals IN0 to IN3 are input to the target circuits 12 to 15; and the output control circuit 30 is controlled in such a manner that output signals from the target circuits 12 to 15 become the output signals OUT0 to OUT3.

Specifically, the characteristic adjustment circuit 40 inputs low-level control signals to the control terminals of the selectors 21 to 23; and inputs high-level control signals to the control terminals of the selectors 31 to 34.

Accordingly, the input signal IN0 is input to the target circuit 12; the input signal IN1 is input to the target circuit 13; the input signal IN2 is input to the target circuit 14; and the input signal IN3 is input to the target circuit 15. Further, an output signal from the target circuit 12 becomes the output signal OUT0; an output signal from the target circuit 13 becomes the output signal OUT1; an output signal from the target circuit 14 becomes the output signal OUT2; and an output signal from the target circuit 15 becomes the output signal OUT3.

In this case, although the input signal IN0 is also input to the target circuit 11, an output signal from the target circuit 11 would not be used for the output signals OUT0 to OUT3. The target circuit 11 is therefore in the unused state, and even if the characteristic adjustment circuit 40 performs predetermined characteristic adjustment processing with respect to the target circuit 11, it does not have an effect on normal operation of the circuit 100.

[Characteristic Adjustment of Target Circuit 12]

Next, when the characteristic adjustment of the target circuit 12 is performed, the input control circuit 20 is controlled in such a manner that the input signals IN0 to IN3 are input to the target circuits 11 and 13 to 15; and the output control circuit 30 is controlled in such a manner that output signals from the target circuits 11 and 13 to 15 become the output signals OUT0 to OUT3.

Specifically, the characteristic adjustment circuit 40 inputs the low-level control signals to the control terminals of the selectors 22 and 23; inputs the high-level or low-level control signal to the control terminal of the selector 21; inputs the low-level control signal to the control terminal of the selector 31; and inputs the high-level control signals to the control terminals of the selectors 32 to 34.

Accordingly, the input signal IN0 is input to the target circuit 11; the input signal IN1 is input to the target circuit 13; the input signal IN2 is input to the target circuit 14; and the input signal IN3 is input to the target circuit 15. Further, an output signal from the target circuit 11 becomes the output signal OUT0; an output signal from the target circuit 13 becomes the output signal OUT1; an output signal from the target circuit 14 becomes the output signal OUT2; and an output signal from the target circuit 15 becomes the output signal OUT3.

In this case, although the input signal IN0 or the input signal IN1 is also input to the target circuit 12, an output signal from the target circuit 12 would not be used for the output signals OUT0 to OUT3. The target circuit 12 is therefore in the unused state, and even if the characteristic adjustment circuit 40 performs predetermined characteristic adjustment processing with respect to the target circuit 12, it does not have an effect on normal operation of the circuit 100.

[Characteristic Adjustment of Target Circuit 13]

Next, when the characteristic adjustment of the target circuit 13 is performed, the input control circuit 20 is controlled in such a manner that the input signals IN0 to IN3 are input to the target circuits 11, 12, 14 and 15; and the output control circuit 30 is controlled in such a manner that output signals from the target circuits 11, 12, 14 and 15 become the output signals OUT0 to OUT3.

Specifically, the characteristic adjustment circuit 40 inputs the low-level control signal to the control terminal of the selector 23; inputs the high-level control signal to the control terminal of the selector 21; inputs the high-level or low-level control signal to the control terminal of the selector 22; inputs the low-level control signals to the control terminals of the selectors 31 and 32; and inputs the high-level control signals to the control terminals of the selectors 33 and 34.

Accordingly, the input signal IN0 is input to the target circuit 11; the input signal IN1 is input to the target circuit 12; the input signal IN2 is input to the target circuit 14; and the input signal IN3 is input to the target circuit 15. Further, an output signal from the target circuit 11 becomes the output signal OUT0; an output signal from the target circuit 12 becomes the output signal OUT1; an output signal from the target circuit 14 becomes the output signal OUT2; and an output signal from the target circuit 15 becomes the output signal OUT3.

In this case, although the input signal IN1 or the input signal IN2 is also input to the target circuit 13, an output signal from the target circuit 13 would not be used for the output signals OUT0 to OUT3. The target circuit 13 is therefore in the unused state, and even if the characteristic adjustment circuit 40 performs predetermined characteristic adjustment processing with respect to the target circuit 13, it does not have an effect on normal operation of the circuit 100.

[Characteristic Adjustment of Target Circuit 14]

Next, when the characteristic adjustment of the target circuit 14 is performed, the input control circuit 20 is controlled in such a manner that the input signals IN0 to IN3 are input to the target circuits 11 to 13 and 15; and the output control circuit 30 is controlled in such a manner that output signals from the target circuits 11 to 13 and 15 become the output signals OUT0 to OUT5.

Specifically, the characteristic adjustment circuit 40 inputs the high-level control signals to the control terminals of the selectors 21 and 22; inputs the high-level or low-level control signal to the control terminal of the selector 23; inputs the low-level control signals to the control terminals of the selectors 31 to 33; and inputs the high-level control signal to the control terminal of the selector 34.

Accordingly, the input signal IN0 is input to the target circuit 11; the input signal IN1 is input to the target circuit 12; the input signal IN2 is input to the target circuit 13; and the input signal IN3 is input to the target circuit 15. Further, an output signal from the target circuit 11 becomes the output signal OUT0; an output signal from the target circuit 12 becomes the output signal OUT1; an output signal from the target circuit 13 becomes the output signal OUT2; and an output signal from the target circuit 15 becomes the output signal OUT3.

In this case, although the input signal IN2 or the input signal IN3 is also input to the target circuit 14, an output signal from the target circuit 14 would not be used for the output signals OUT0 to OUT3. The target circuit 14 is therefore in the unused state, and even if the characteristic adjustment circuit 40 performs predetermined characteristic adjustment processing with respect to the target circuit 14, it does not have an effect on normal operation of the circuit 100.

[Characteristic Adjustment of Target Circuit 15]

Next, when the characteristic adjustment of the target circuit 15 is performed, the input control circuit 20 is controlled in such a manner that the input signals IN0 to IN3 are input to the target circuits 11 to 14; and the output control circuit 30 is controlled in such a manner that output signals from the target circuits 11 to 14 become the output signals OUT0 to OUT3.

Specifically, the characteristic adjustment circuit 40 inputs the high-level control signals to the control terminals of the selectors 21 to 23; and inputs the low-level control signals to the control terminals of the selectors 31 to 34.

Accordingly, the input signal IN0 is input to the target circuit 11; the input signal IN1 is input to the target circuit 12; the input signal IN2 is input to the target circuit 13; and the input signal IN3 is input to the target circuit 14. Further, an output signal from the target circuit 11 becomes the output signal OUT0; an output signal from the target circuit 12 becomes the output signal OUT1; an output signal from the target circuit 13 becomes the output signal OUT2; and an output signal from the target circuit 14 becomes the output signal OUT3.

In this case, although the input signal IN3 is also input to the target circuit 15, an output signal from the target circuit 15 would not be used for the output signals OUT0 to OUT3. The target circuit 15 is therefore in the unused state, and even if the characteristic adjustment circuit 40 performs predetermined characteristic adjustment processing with respect to the target circuit 15, it does not have an effect on normal operation of the circuit 100.

[Conclusion]

As described above, the circuit 100 according to this embodiment includes the plurality of target circuits 11 to 15, the number of the target circuits 11 to 15 being more than the required number of the target circuits; and the characteristic adjustment circuit 40 to adjust characteristics of the target circuits 11 to 15 and to control the state of each of the target circuits 11 to 15 between the used state and the unused state. The characteristic adjustment circuit 40 controls the required number of the target circuits to be in the used state and controls the rest of the target circuits to be in the unused state. The characteristic adjustment circuit 40 adjusts the characteristics with respect to the target circuits in the unused state.

Accordingly, the circuit characteristics of any one of the target circuits 11 to 15 may be adjusted during the normal operation of the circuit 100, and thus the fluctuation of circuit characteristics due to the changes in environment during operation may be suppressed. Furthermore, this may eliminate the need for a design that makes the operation margins of the circuit characteristics relatively large; so it makes it possible to prevent increase in power consumption and circuit area. Note that the circuit 100 which have been described so far may be implemented in various ways. For example, it may be implemented in a state of being incorporated in devices such as electric and electronic apparatuses, or it may be carried out together with another method.

2. Second Embodiment

Figure 3:
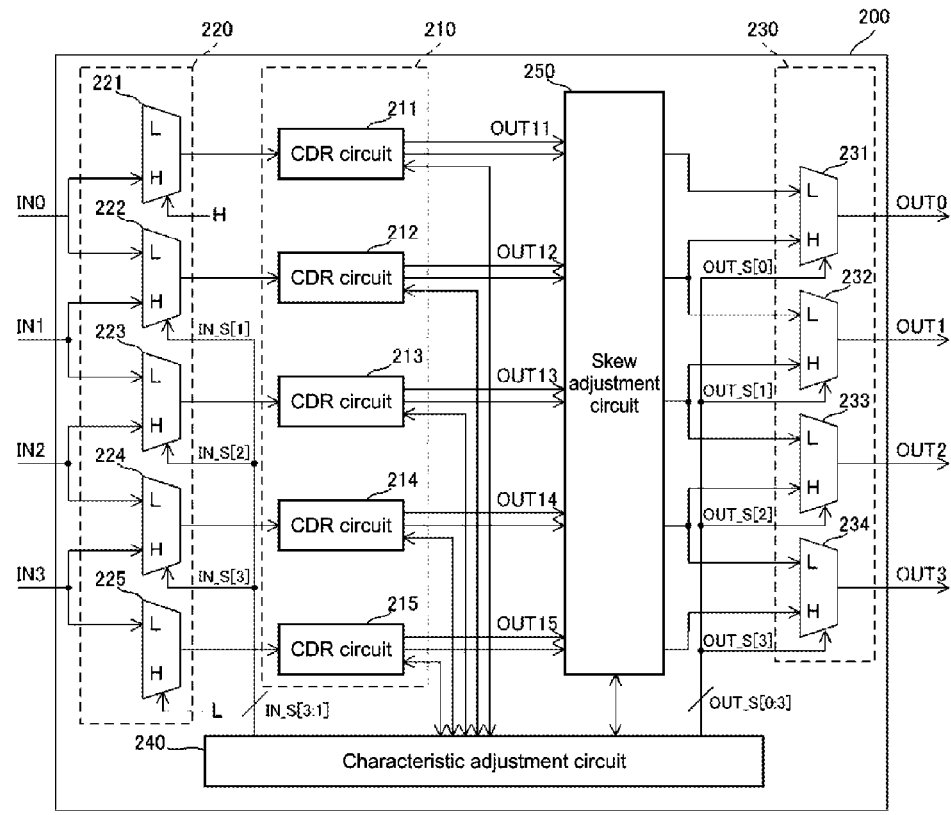
FIG. 3 is a block diagram showing a configuration of a circuit of a second embodiment of the present disclosure.

FIG. 3 shows an example of a configuration of a circuit 200 according to this embodiment. The circuit 200 shown in FIG. 3 is provided as an example of a receiver for high-speed serial transmission. The circuit 200 includes a clock data recovery circuit group (CDR circuit group) 210, an input control circuit 220, an output control circuit 230, a characteristic adjustment circuit 240 and a skew adjustment circuit 250. In this embodiment, the characteristic adjustment circuit 240 also functions as a control unit of the input control circuit 220, the output control circuit 230 and the skew adjustment circuit 250.

The circuit 200 receives a predetermined number of input signals IN0 to IN3 and outputs a predetermined number of output signals OUT0 to OUT5. The input signals IN0 to IN3 input to the circuit 200 is input to at least one clock data recovery circuit (CDR circuit) of the CDR circuit group 210.

Each CDR circuit makes data and a clock parallel, in order to reduce frequency before inputting data and clocks to a subsequent digital part. Since the clocks to be paralleled are frequency divided clocks divided by free-running counters of the respective CDR circuits, the data and the clocks output from the CDR circuits have skews.

[CDR Circuit Group]

The CDR circuit group 210 of the example shown in FIG. 3 includes the CDR circuits 211 to 215. The CDR circuits 211 to 215 have circuit configurations which are the same or compatible, and which perform clock data recovery operation.

The CDR circuits 211 to 215 in the CDR circuit group 210 are made redundant. That is, the CDR circuit group 210 has a larger number of CDR circuits than a minimum number (required number) of CDR circuits required in the circuit 200. Accordingly, during operation of the circuit 200, at least one of the CDR circuits 211 to 215 of the CDR circuit group 210 would be in an unused state.

Note that the unused state of a CDR circuit means a state in which output of the CDR circuit is not used for output processing of the circuit 200; and a used state of a CDR circuit means a state in which output of the CDR circuit is used for output processing of the circuit 200.

In the example shown in FIG. 3, the circuit 200 has five CDR circuits 211 to 215, while the required number of the CDR circuits in the circuit 200 is four. The CDR circuit group 210 therefore has one more CDR circuit in addition to the required number of the CDR circuits. Accordingly, when the CDR circuits 211 to 214 are in the used state, the CDR circuit 215 is in the unused state. When the CDR circuits 211 to 213 and 215 are in the used state, the CDR circuit 214 is in the unused state. When the CDR circuits 211, 212, 214 and 215 are in the used state, the CDR circuit 213 is in the unused state. When the CDR circuits 211 and 213 to 215 are in the used state, the CDR circuit 212 is in the unused state. When the CDR circuits 212 to 215 are in the used state, the CDR circuit 211 is in the unused state.

[Skew Adjustment Circuit]

The skew adjustment circuit 250 performs skew adjustment with respect to the data and the clock output from each CDR circuit. In this embodiment, there exists a CDR circuit outputting the same data series as that output from a CDR circuit which is undergoing the adjustment.

For example, during the characteristic adjustment that will be described later; while the CDR circuit 211 is undergoing the adjustment, the CDR circuit 212 outputs the same data series as that output from the CDR circuit 211. While the CDR circuit 212 is undergoing the adjustment, the CDR circuit 211 or the CDR circuit 213 outputs the same data series as that output from the CDR circuit 212. While the CDR circuit 213 is undergoing the adjustment, the CDR circuit 212 or the CDR circuit 214 outputs the same data series as that output from the CDR circuit 213. While the CDR circuit 214 is undergoing the adjustment, the CDR circuit 213 or the CDR circuit 215 outputs the same data series as that output from the CDR circuit 214. While the CDR circuit 215 is undergoing the adjustment, the CDR circuit 214 outputs the same data series as that output from the CDR circuit 215.

As will be described later, since the characteristic adjustment circuit 240 takes control of selectors 221 to 225, the characteristic adjustment circuit 240 is capable of distinguishing between a CDR circuit undergoing the characteristic adjustment and a CDR circuit which receives the same data series as that of the CDR circuit undergoing the characteristic adjustment. Hence, depending on a control state of the selectors, the characteristic adjustment circuit 240 instructs the skew adjustment circuit 250 to adjust the skew of the data series output from the CDR circuit undergoing the characteristic adjustment; and instructs the skew adjustment circuit 250 to use, as a reference for the adjustment of the skew, the data series output from the CDR circuit receiving the same data series as that of the CDR circuit undergoing the characteristic adjustment.

The skew adjustment circuit 250 compares the data and the clock of output data series from the CDR circuit undergoing the characteristic adjustment, with the data and the clock of output data series from a CDR circuit outputting the same data series as that of the CDR circuit undergoing the characteristic adjustment; and thus the skew adjustment circuit 250 detects and adjusts the skews.

[Input Control Circuit]

The input control circuit 220 selects at least one of the CDR circuits 211 to 215 and switches input destination of the input signals IN0 to IN3, which have been input to the circuit 200, to the selected CDR circuit. At this time, same input signals may be input to different CDR circuits.

In the example shown in FIG. 3, the input control circuit 220 includes the selectors 221 to 225 to be controlled by the characteristic adjustment circuit 240 as the control unit. Each of the selectors 221 to 225 includes a control terminal, an L input terminal, an H input terminal and an output terminal. The selectors 222 to 224 have their respective control terminals connected to the characteristic adjustment circuit 40.

The selector 221 has the L input terminal to which no input is given; the H input terminal to which the input signal IN0 is input; and the output terminal connected to the CDR circuit 211. A high-level control signal is input to the control terminal of the selector 221; and the selector 221 outputs the input signal IN0 from the output terminal to the CDR circuit 211.

The selector 222 has the L input terminal to which the input signal IN0 is input; the H input terminal to which the input signal IN1 is input; and the output terminal connected to the CDR circuit 212. When a low-level control signal is input to the control terminal of the selector 222, the selector 222 outputs the input signal IN0 from the output terminal to the CDR circuit 212; the input signal IN0 being input to the L input terminal. When the high-level control signal is input to the control terminal, the selector 222 outputs the input signal IN1 from the output terminal to the CDR circuit 212; the input signal IN1 being input to the H input terminal.

The selector 223 has the L input terminal to which the input signal IN1 is input; the H input terminal to which the input signal IN2 is input; and the output terminal connected to the CDR circuit 213. When the low-level control signal is input to the control terminal of the selector 223, the selector 223 outputs the input signal IN1 from the output terminal to the CDR circuit 213; the input signal IN1 being input to the L input terminal. When the high-level control signal is input to the control terminal, the selector 223 outputs the input signal IN2 from the output terminal to the CDR circuit 213; the input signal IN2 being input to the H input terminal.

The selector 224 has the L input terminal to which the input signal IN2 is input; the H input terminal to which the input signal IN3 is input; and the output terminal connected to the CDR circuit 214. When the low-level control signal is input to the control terminal of the selector 224, the selector 224 outputs the input signal IN2 from the output terminal to the CDR circuit 214; the input signal IN2 being input to the L input terminal. When the high-level control signal is input to the control terminal, the selector 224 outputs the input signal IN3 from the output terminal to the CDR circuit 214; the input signal IN3 being input to the H input terminal.

The selector 225 has the L input terminal to which the input signal IN3 is input; the H input terminal to which no input is given; and the output terminal connected to the CDR circuit 215. The low-level control signal is input to the control terminal of the selector 225; and the selector 225 outputs the input signal IN3 from the output terminal to the CDR circuit 215.

[Output Control Circuit]

The output control circuit 230 outputs four output signals as the output signals OUT0 to OUT5 of the circuit 200, the four output signals being selected from five output signals OUT11 to OUT15 which have been output by the CDR circuits 211 to 215.

In the example shown in FIG. 3, the output control circuit 230 includes selectors 231 to 234 to be controlled by the characteristic adjustment circuit 240 as the control unit. Each of the selectors 231 to 234 includes a control terminal, an L input terminal, an H input terminal and an output terminal. The control terminals of the respective selectors 231 to 234 are connected to the characteristic adjustment circuit 240.

The selector 231 has the L input terminal to which the output signal OUT11 from the CDR circuit 211 is input via the skew adjustment circuit 250; and the H input terminal to which the output signal OUT12 from the CDR circuit 212 is input via the skew adjustment circuit 250. The selector 231 outputs one of the output signal OUT11 and the output signal OUT12 from the output terminal; under the control of the characteristic adjustment circuit 240. The signal output from the output terminal would be the output signal OUT0 of the circuit 200.

The selector 232 has the L input terminal to which the output signal OUT12 from the CDR circuit 212 is input via the skew adjustment circuit 250; and the H input terminal to which the output signal OUT13 from the CDR circuit 213 is input via the skew adjustment circuit 250. The selector 232 outputs one of the output signal OUT12 and the output signal OUT13 from the output terminal; under the control of the characteristic adjustment circuit 240. The signal output from the output terminal would be the output signal OUT1 of the circuit 200.

The selector 233 has the L input terminal to which the output signal OUT13 from the CDR circuit 213 is input via the skew adjustment circuit 250; and the H input terminal to which the output signal OUT14 from the CDR circuit 214 is input via the skew adjustment circuit 250. The selector 233 outputs one of the output signal OUT13 and the output signal OUT14 from the output terminal; under the control of the characteristic adjustment circuit 240. The signal output from the output terminal would be the output signal OUT2 of the circuit 200.

The selector 234 has the L input terminal to which the output signal OUT14 from the CDR circuit 214 is input via the skew adjustment circuit 250; and the H input terminal to which the output signal OUT15 from the CDR circuit 215 is input via the skew adjustment circuit 250. The selector 234 outputs one of the output signal OUT14 and the output signal OUT15 from the output terminal; under the control of the characteristic adjustment circuit 240. The signal output from the output terminal would be the output signal OUTS of the circuit 200.

[Description of Each State]

In this embodiment, the characteristic adjustment circuit 240 sequentially regulates the CDR circuits 211 to 215 to the unused state in substantially the same manner as that described above for the target circuits 11 to 15; and adjusts the characteristics with respect to the CDR circuit of the unused state. Accordingly, control of the input control circuit 220 and the output control circuit 230 when the characteristic adjustment of each of the CDR circuits 211 to 215 is performed is substantially the same as that described above for the control of the input control circuit 20 and the output control circuit 30 of the first embodiment; so this will not be described in detail again.

Examples of the characteristic adjustment to be performed by the characteristic adjustment circuit 240 of this embodiment include stationary phase error adjustment between input data and a recovery clock; adjustment of a frequency sensitivity of a voltage-controlled oscillator (VCO) included in a CDR circuit; free running frequency adjustment of a gated-VCO based CDR; and the like.

[Adjustment of Stationary Phase Error]

Figure 4:
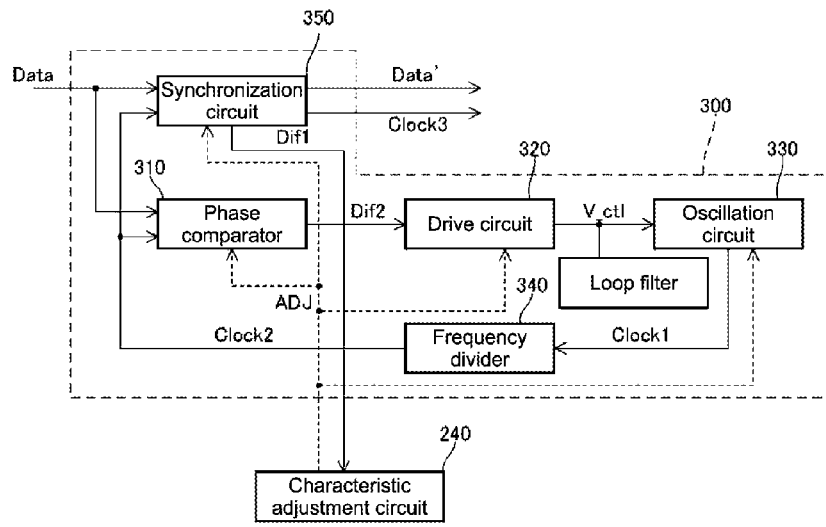
FIG. 4 illustrates stationary phase error adjustment between input data and a recovery clock.

FIG. 4 illustrates stationary phase error adjustment between input data and a recovery clock, illustrating as an example of the CDR circuit a clock recovery phase locked loop (PLL) circuit.

As shown in FIG. 4, a clock recovery PLL 300 includes a phase comparator 310, a drive circuit 320, an oscillation circuit 330, a frequency divider 340 and a synchronization circuit 350.

The phase comparator 310 receives a data signal Data, and also receives a recovery clock signal Clock2 output from the frequency divider 340. The phase comparator 310 compares phases between rising edges of the data signal Data and rising edges of the recovery clock signal Clock2; and generates an in-loop phase error signal Dif2.

The drive circuit 320 receives the in-loop phase error signal Dif2 from the phase comparator 310; and generates a control voltage V_ctl from the in-loop phase error signal Dif2 by charge pump. A loop filter connected to an output terminal of the drive circuit 320 smoothes the control voltage V_ctl into a direct current by a capacitor.

The oscillation circuit 330 receives the smoothed control voltage V_ctl from the drive circuit 320; and generates a signal having a frequency corresponding to the smoothed control voltage V_ctl, as a multiplied clock signal Clock1, by a VCO (voltage-controlled oscillator).

The frequency divider 340 receives the multiplied clock signal Clock1 from the oscillation circuit 330; and feeds back a signal obtained by dividing the frequency of the multiplied clock signal Clock1, as the recovery clock signal Clock2, to the phase comparator 310. The recovery clock signal Clock2 is also input to the synchronization circuit 350.

The synchronization circuit 350 receives the data signal Data and the recovery clock signal Clock2 as input; latches the data signal Data by, for example, a D-flip-flop, in such a manner that the data signal Data becomes synchronized with falling edges of the recovery clock signal Clock2; and outputs synchronized data signal Data' and a synchronized clock signal Clock3 indicating timing to fetch this synchronized data signal Data'.

The synchronization circuit 350 further has a function of outputting an out-of-loop phase error signal Dif1 indicating a phase offset between the rising edges of the data signal Data and the rising edges of the recovery clock signal Clock2.

The characteristic adjustment circuit 240 receives the out-of-loop phase error signal Dif1. The characteristic adjustment circuit 240 has a function of finding an adjustment signal ADJ which controls at least one of the phase comparator 310, the drive circuit 320, the oscillation circuit 330 and the synchronization circuit 350, in such a manner that a time of at least T/2 is secured as each of a setup time and a holding time of the data signal Data with respect to the falling edges of the recovery clock signal Clock2, based on the out-of-loop phase error signal Dif1 provided from the synchronization circuit 350. The characteristic adjustment circuit 240 also has a function of holding this adjustment signal ADJ.

In the following, an example of how the adjustment signal ADJ is used in each of the phase comparator 310, the drive circuit 320, the oscillation circuit 330 and the synchronization circuit 350 will be described.

[Example of Use of Adjustment Signal in Phase Comparator]

Figure 5:
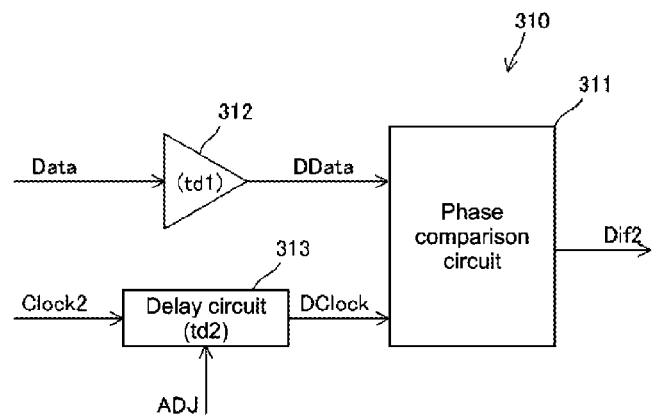
FIG. 5 is a block diagram showing an example of an internal configuration of a phase comparator.

FIG. 5 shows an example of an internal configuration of the phase comparator 310.

The phase comparator 310 in FIG. 5 includes a phase comparison circuit 311, a delay buffer 312 and a delay circuit 313.

The delay buffer 312 provides, to the phase comparison circuit 311, a delay data signal DData resulting from delaying the data signal Data by a fixed delay time td1.

The delay circuit 313 provides, to the phase comparison circuit 311, a delay clock signal DClock resulting from delaying the recovery clock signal Clock2 by a variable delay time td2. The adjustment signal ADJ is used as a signal for adjusting the delay time td2.

The phase comparison circuit 311 is a circuit in which a comparison circuit for comparing phases between rising edges of the delay data signal DData and rising edges of the delay clock signal DClock2 is implemented; and is configured to provide the in-loop phase error signal Dif2 to the drive circuit 320.

Here, the phase comparison circuit 311 performs PLL control to make the delay data signal DData and the delay clock signal DClock2 rise at the same timing. Accordingly, if one delay time td2 is changed while another delay time td1 is fixed, a phase relationship between the rising edges of the data signal Data and the rising edges of the recovery clock signal Clock2 would be changed, in the input to the phase comparator 310. It is therefore possible to adjust a phase relationship between the rising edges of the data signal Data and the rising edges of the recovery clock signal Clock2 in the input to the synchronization circuit 350, by using the adjustment signal ADJ.

[Example of Use of Adjustment Signal in Drive Circuit]

Figure 6:
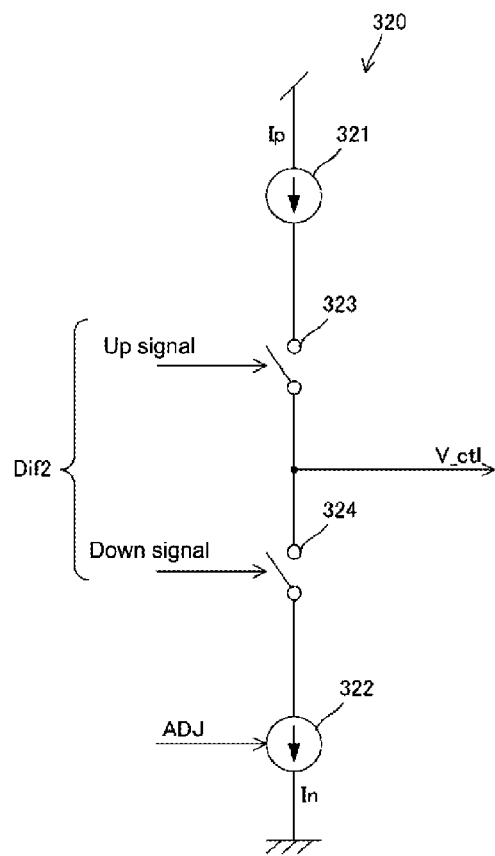
FIG. 6 is a block diagram showing an example of an internal configuration of a drive circuit.

FIG. 6 shows an example of an internal configuration of the drive circuit 320.

The phase comparator 320 in FIG. 6 includes a source-side current source 321, a sink-side current source 322, a first switch 323 and a second switch 324.

The source-side current source 321 supplies a current Ip (fixed value) to a signal line of the control voltage V_ctl when the first switch 323 is closed. The sink-side current source 322 draws a current In (variable value) from the signal line of the control voltage V_ctl when the second switch 324 is closed. The adjustment signal ADJ is used as a signal for adjusting the value of the current In.

The in-loop phase error signal Dif2 includes an up signal indicating that the phase of the recovery clock signal Clock2 is to be put forward; and a down signal indicating that the phase of the recovery clock signal Clock2 is to be delayed. The up signal controls opening and closing of the first switch 323; and the down signal controls opening and closing of the second switch 324.

Figure 7:
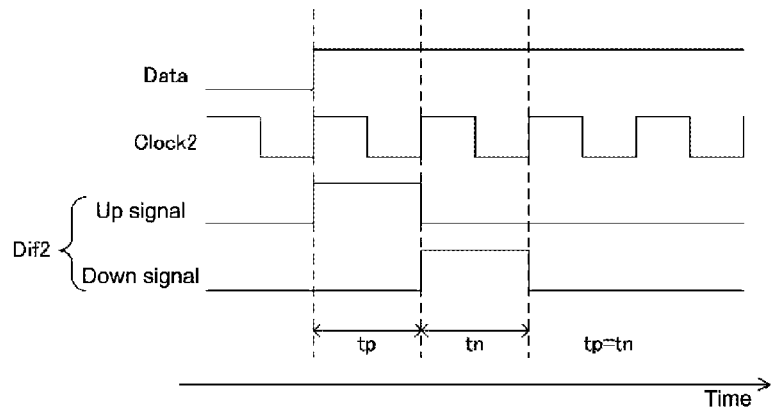
FIG. 7 is a time chart describing an operation of the drive circuit.
Figure 8:
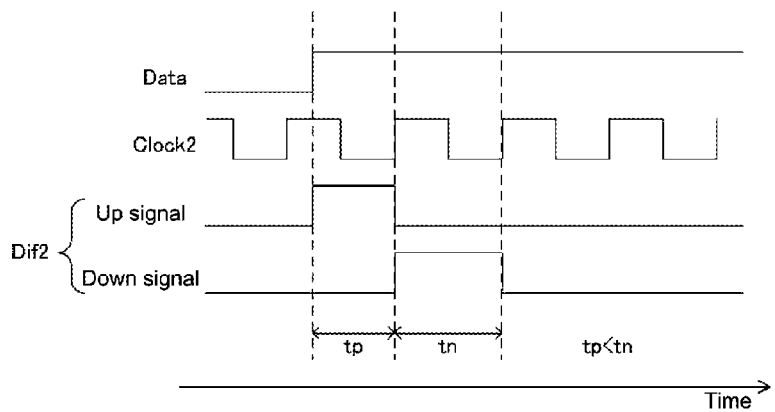
FIG. 8 is a time chart describing an operation of the drive circuit.
Figure 9:
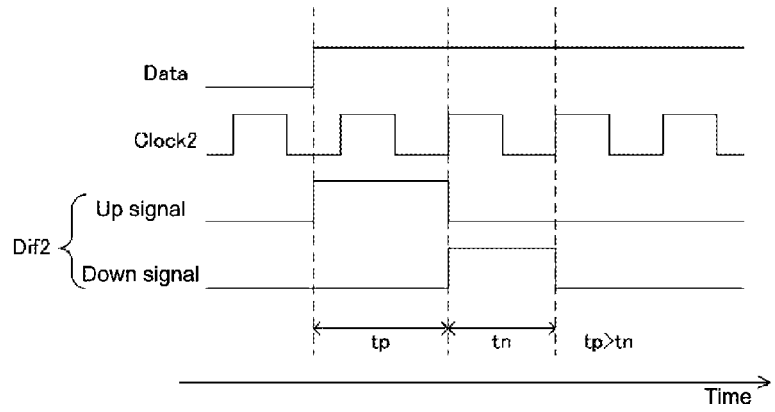
FIG. 9 is a time chart describing an operation of the drive circuit.

FIGS. 7 to 9 are time charts describing an operation of the drive circuit 320. In these figures, each pulse width of the up signal is denoted by tp; and each pulse width of the down signal is denoted by tn.

FIG. 7 shows a state in which the phases of the recovery clock signal Clock2 and the data signal Data are the same in the input to the phase comparator 310. As shown in FIG. 7, when Ip=In, a relation tp=tn is established, and the PLL control is performed in such a manner that the data signal Data and the recovery clock signal Clock2 rise at the same timing in the input to the phase comparator 310.

FIG. 8 shows a state in which the recovery clock signal Clock2 is ahead of the data signal Data, in the input to the phase comparator 310. As shown in FIG. 8, when Ip>In, a relation tp<tn is established, and the rising edges of the recovery clock signal Clock2 has a phase ahead of that of the rising edges of the data signal Data in the input to the phase comparator 310.

FIG. 9 shows a state in which the recovery clock signal Clock2 is behind the data signal Data, in the input to the phase comparator 310. As shown in FIG. 9, when Ip<In, a relation tp>tn is established, and the rising edges of the recovery clock signal Clock2 has a phase behind that of the rising edges of the data signal Data in the input to the phase comparator 310.

Thus, as described above, if one value of the current In is changed while another value of the current Ip is fixed, a phase relationship between the rising edges of the data signal Data and the rising edges of the recovery clock signal Clock2 would be changed, in the input to the phase comparator 310. It is therefore possible to adjust a phase relationship between the rising edges of the data signal Data and the rising edges of the recovery clock signal Clock2 in the input to the synchronization circuit 350, by using the adjustment signal ADJ.

Note that it is also possible to make the source-side current Ip variable and the sink-side current In fixed. Moreover, both the currents Ip and In may be variable. In cases where the drive circuit 320 is not made to use the adjustment signal ADJ, it is possible to fix both the values of the currents Ip and In.

[Example of Use of Adjustment Signal in Oscillation Circuit]

Figure 10:
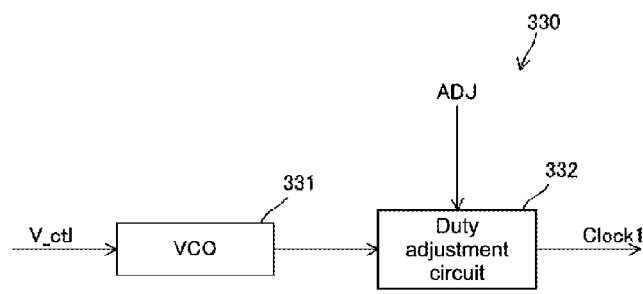
FIG. 10 is a block diagram showing an example of an internal configuration of an oscillation circuit.

FIG. 10 shows an example of an internal configuration of the oscillation circuit 330.

The oscillation circuit 330 in FIG. 10 includes a voltage-controlled oscillator (VCO) 331 and a duty adjustment circuit 332. The VCO 331 generates a signal having a frequency corresponding to the control voltage V_ctl. The duty adjustment circuit 332 adjusts duty of the signal generated by the VCO 331, by pulse-width modulation; and provides the result as the multiplied clock signal Clock1. The adjustment signal ADJ is used as a signal for adjusting the duty in the pulse-width modulation.

Figure 11:
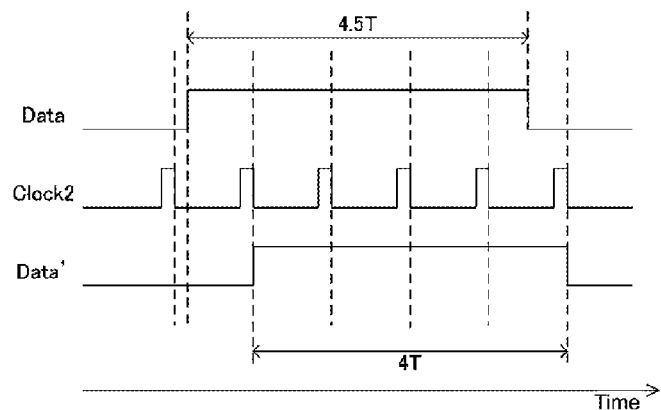
FIG. 11 is a time chart describing an operation of the oscillation circuit.
Figure 12:
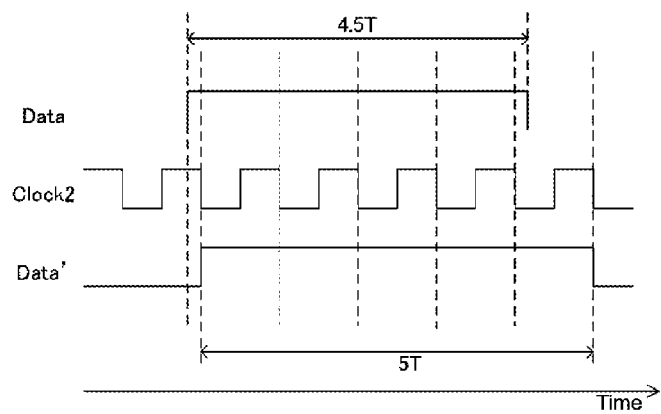
FIG. 12 is a time chart describing an operation of the oscillation circuit.
Figure 13:
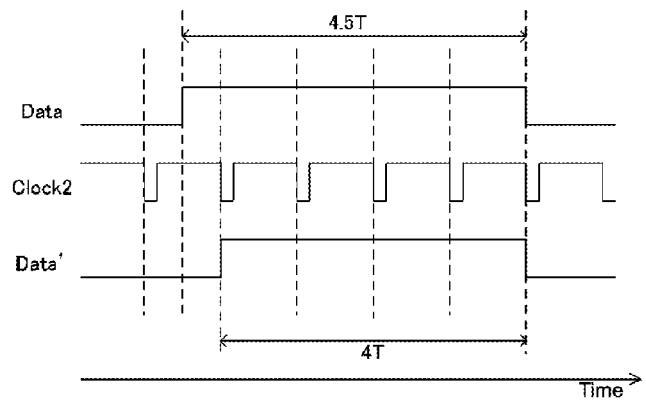
FIG. 13 is a time chart describing an operation of the oscillation circuit.

FIGS. 11 to 13 are time charts describing an operation of the oscillation circuit 330.

In the example described by these figures, the characteristic adjustment circuit 240 does not adjust the phase relationship between the rising edges of the data signal Data and the rising edges of the recovery clock signal Clock2. Instead, the characteristic adjustment circuit 240 controls to gradually increase duty of the recovery clock signal Clock2.

FIG. 11 shows a state in which the recovery clock signal Clock2 is ahead of the data signal Data, in the input to the synchronization circuit 350, and the duty of the recovery clock signal Clock2 is 12.5%. In this state, a high-level interval of the synchronized data signal Data' is 4 T; and the holding time of the data signal Data with respect to the falling edges of the recovery clock signal Clock2 is shorter than T/2.

FIG. 12 shows a state in which the recovery clock signal Clock2 is ahead of the data signal Data, in the input to the synchronization circuit 350, and the duty of the recovery clock signal Clock2 is 50%. In this state, the high-level interval of the synchronized data signal Data' is 5 T; and the setup time of the data signal Data with respect to the falling edges of the recovery clock signal Clock2 is shorter than T/2.

FIG. 13 shows a state in which the recovery clock signal Clock2 is ahead of the data signal Data, in the input to the synchronization circuit 350, and the duty of the recovery clock signal Clock2 is 87.5%. In this state, the high-level interval of the synchronized data signal Data' is 4 T; and a time of at least T/2 is secured as each of the setup time and the holding time of the data signal Data with respect to the falling edges of the recovery clock signal Clock2. Therefore, a probability of an occurrence of mislatching in the synchronization circuit 350 would be the lowest if the data signal Data is provided in this state.

The characteristic adjustment circuit 240 may find the adjustment signal ADJ of the time at which the state of the synchronized data signal Data' with respect to the data signal Data has transited from 5 T/3 T to 4 T/4 T; and may hold the obtained adjustment signal ADJ. This makes it possible to reduce the probability of the occurrence of mislatching in the synchronization circuit 350.

Note that in cases where the oscillation circuit 330 is not made to use the adjustment signal ADJ, the duty adjustment circuit 332 in FIG. 10 may be omitted; and the VCO331 may be made to provide the multiplied clock signal Clock1.

[Example of Use of Adjustment Signal in Synchronization Circuit]

Figure 14:
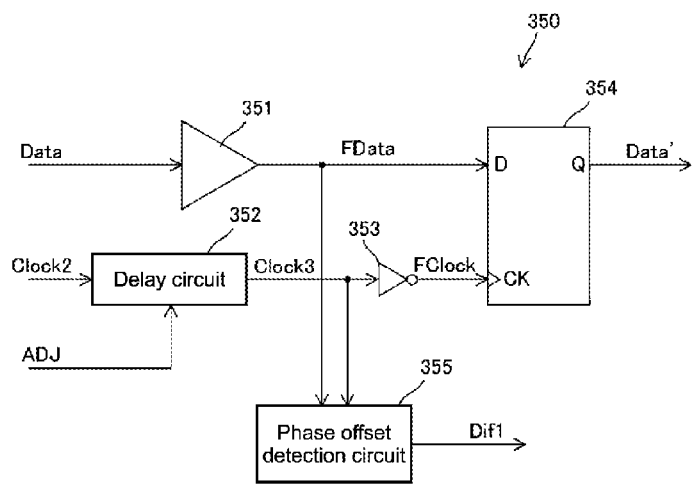
FIG. 14 is a block diagram showing an example of an internal configuration of a synchronization circuit.

FIG. 14 shows an example of an internal configuration of the synchronization circuit 350.

The synchronization circuit 350 in FIG. 14 includes a delay buffer 351, a delay circuit 352, an inverter 353, a D-flip-flop 354 and a phase offset detection circuit 355.

The delay buffer 351 provides, to a data-input terminal D of the D-flip-flop 354, a normal-phase data signal FData resulting from delaying the data signal Data by a fixed delay time.

The delay circuit 352 provides, to an input terminal of the inverter 353, a signal resulting from delaying the recovery clock signal Clock2 by a variable delay time. The adjustment signal ADJ is used as a signal for adjusting the delay time in the delay circuit 352.

The inverter 353 provides, to a clock-input terminal CK of the D-flip-flop 354, an inverted clock signal FClock resulting from inverting the output of the delay circuit 352. The D-flip-flop 354 latches the normal-phase data signal FData in synchronization with rising edges of the inverted clock signal FClock. A Q-output of the D-flip-flop 354 is the synchronized data signal Data'; and the output of the delay circuit 352 is the synchronized clock signal Clock3.

The phase offset detection circuit 355 provides, to the characteristic adjustment circuit 240, the out-of-loop phase error signal Diff indicating a phase offset between rising edges of the normal-phase data signal FData and rising edges of the synchronized clock signal Clock3 in a test mode.

With the synchronization circuit 350 of FIG. 14, by changing the delay time in the delay circuit 352, by using the adjustment signal ADJ, while keeping the delay time in the delay buffer 351 fixed, it is possible to adjust the phase relationship between the rising edges of the data signal Data and the rising edges of the recovery clock signal Clock2 in the input to the synchronization circuit 350. Note that the positions of the delay buffer 351 and the delay circuit 352 in the configuration of FIG. 14 may be swapped.

In cases where the synchronization circuit 350 is not made to use the adjustment signal ADJ, the delay buffer 351 and the delay circuit 352 in FIG. 14 may be omitted; the data signal Data may be directly input to the data-input terminal D of the D-flip-flop 354; and the recovery clock signal Clock2 may be directly input to the input terminal of the inverter 353.

[Adjustment of Frequency Sensitivity of VCO]

Figure 15:
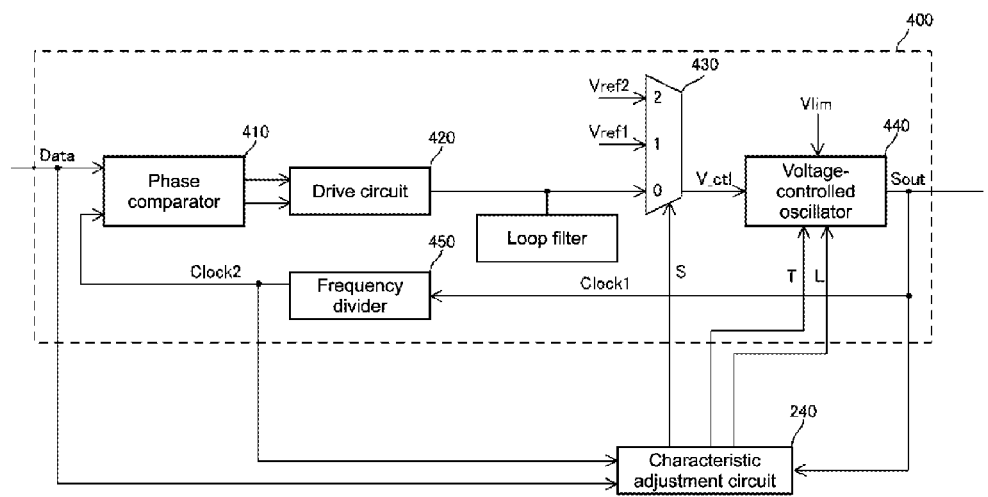
FIG. 15 illustrates adjustment of a frequency sensitivity of a voltage-controlled oscillator (VCO)

FIG. 15 illustrates adjustment of a frequency sensitivity of a voltage-controlled oscillator (VCO), illustrating as an example of the CDR circuit an automatically adjustable phase synchronization circuit (PLL). Note that FIG. 15 describes only the configuration used for the adjustment of the frequency sensitivity of the voltage-controlled oscillator.

A PLL 400 includes a phase comparator 410, a drive circuit 420, a selector 430, a voltage-controlled oscillator 440 and a frequency divider 450.

The phase comparator 410 receives a data signal Data, and also receives a recovery clock signal Clock2 output from the frequency divider 450. The phase comparator 410 compares phases between rising edges of the data signal Data and rising edges of the recovery clock signal Clock2; and generates an in-loop phase error signal Dif2.

The drive circuit 420 receives the in-loop phase error signal Dif2 from the phase comparator 410; and generates a pulse signal from the in-loop phase error signal Dif2 by charge pump. A loop filter connected to an output terminal of the drive circuit 420 smoothes the pulse signal output from the drive circuit 420 into a direct-current voltage.

The selector 430 selects and outputs a control voltage V_ctl from the direct-current voltage input by the drive circuit 420, a first reference voltage Vref1 and a second reference voltage Vref2; based on a selection signal S input from the characteristic adjustment circuit 240.

The voltage-controlled oscillator 440 receives the control voltage V_ctl from the selector 430; and generates a signal having a frequency corresponding to the control voltage V_ctl, as a multiplied clock signal Clock1.

Furthermore, the voltage-controlled oscillator 440 includes a voltage-current converting circuit having a limiting function; and it is capable of automatically trimming an upper limit frequency. That is, the control voltage V_ctl, a reference voltage Vlim, as well as a trimming signal T and a limiting signal L provided from the characteristic adjustment circuit 240, are input to the voltage-controlled oscillator 440; and the voltage-controlled oscillator 440 may change the frequency of the multiplied clock signal Clock1 having the frequency corresponding to the control voltage V_ctl, while limiting the upper limit frequency of an output signal Sout. The voltage-controlled oscillator 440 is capable of changing a frequency characteristics sensitivity of the output signal Sout to be output with respect to the control voltage V_ctl, by using the trimming signal T; and changing the upper limit frequency of the output signal Sout, by using the limiting signal L. The adjustment signal ADJ is used as the trimming signal T in the adjustment of the frequency sensitivity of the VCO.

The frequency divider 450 receives the multiplied clock signal Clock1 from the voltage-controlled oscillator 440; and feeds back a signal obtained by dividing the frequency of the multiplied clock signal Clock1, as the recovery clock signal Clock2, to the phase comparator 410.

The characteristic adjustment circuit 240 has a function of outputting signals for adjustment in calibration, which are the selection signal S, the trimming signal T and the limiting signal L, obtained from the data signal Data and the recovery clock signal Clock2.

In the PLL 400, the frequency characteristics of the voltage-controlled oscillator 440 are adjusted by the characteristic adjustment circuit 240 during an adjustment period. In this adjustment period, a determination would be repeated, and the trimming signal T and the limiting signal L would be updated, until a frequency of the output signal Sout of the voltage-controlled oscillator 440 reaches a predetermined frequency.

When the characteristic adjustment begins, the characteristic adjustment circuit 240 sets the selection signal S to S=1; and causes the frequency divider 450 to stop outputting the recovery clock signal Clock2. Then, as a result, the frequency divider 450 is not outputting the recovery clock signal Clock2; and the selector 430 selects the first reference voltage Vref1, outputs it as the control voltage V_ctl, and makes the PLL loop open. Further, the characteristic adjustment circuit 240 resets the trimming signal T and the limiting signal L (T=0, L=X).

In this state, the characteristic adjustment circuit 240 starts the determination of the frequency of the output signal Sout. If the characteristic adjustment circuit 240 determines that the frequency of the output signal Sout is less than the predetermined frequency, the characteristic adjustment circuit 240 updates the trimming signal T to T=1 and determines the frequency of the output signal Sout again. The characteristic adjustment circuit 240 further updates the trimming signal T, until the frequency of the output signal Sout becomes equal to or more than the predetermined frequency. When the frequency of the output signal Sout is set to be equal to or more than the predetermined frequency by the update of the trimming signal T, the frequency divider 450 updates the selection signal S to S=2.

At this time, the selector 430 selects the second reference voltage Vref2 and outputs it as the control voltage V_ctl. Furthermore, the characteristic adjustment circuit 240 sets as the trimming signal T a value thereof at the time when the frequency of the output signal Sout has become equal to or more than the predetermined frequency due to the above-described operation; resets the limiting signal L to L=0; and causes the frequency divider 450 to be in a state of not outputting the recovery clock signal Clock2. In this state, the characteristic adjustment circuit 240 starts the determination of the frequency of the output signal Sout.

If the characteristic adjustment circuit 240 determines that the frequency of the output signal Sout is less than the predetermined frequency, the characteristic adjustment circuit 240 updates the limiting signal L to L=1 and determines the frequency of the output signal Sout again. The characteristic adjustment circuit 240 further updates the limiting signal L, until the frequency of the output signal Sout becomes equal to or more than the predetermined frequency. When the frequency of the output signal Sout is set to be equal to or more than the predetermined frequency by the update of the limiting signal L, the characteristic adjustment circuit 240 resets the selection signal S to S=0.

At this time, the selector 430 selects the loop filter. The characteristic adjustment circuit 240 sets as the trimming signal T and the limiting signal L their respective values at the time when the frequency of the output signal Sout has become equal to or more than the predetermined frequency due to the above-described operation; allows the recovery clock signal Clock2 to be output; and makes the PLL loop closed. In this state, the PLL 400 transits to a convergence period.

[Free Running Frequency Adjustment of Gated-VCO Based CDR]

Figure 16:
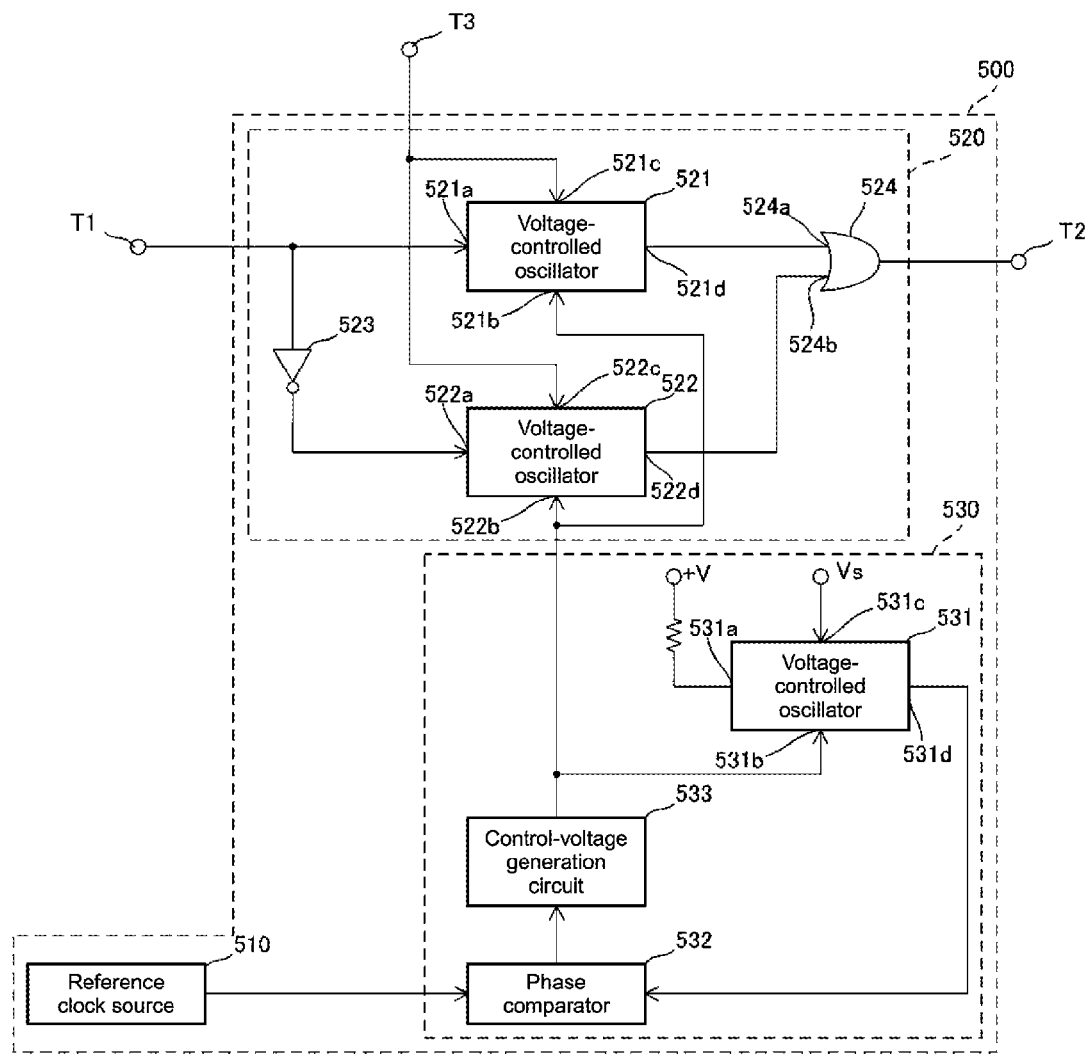
FIG. 16 illustrates free running frequency adjustment of a gated-VCO based CDR.

FIG. 16 illustrates free running frequency adjustment of a gated-VCO based CDR, illustrating as an example of the CDR circuit a multi-bit-rate timing extraction circuit.

A timing extraction circuit 500 shown in FIG. 16 is one which generates a clock that matches a bit phase of a burst signal. The timing extraction circuit 500 includes a burst signal input terminal T1 to receive a burst signal; an output terminal T2 to output a clock, a reference clock source 510 which generates a reference clock; and a bit rate identification signal input terminal T3 which obtains a bit rate of the burst signal that is input to the burst signal input terminal T1, by identifying the bit rate by a circuit (not shown), and which inputs a resulting identification signal obtained therefrom.

The timing extraction circuit 500 also includes a clock generation circuit 520 and a PLL circuit 530.

The clock generation circuit 520 includes voltage-controlled oscillators 521 and 522, an inverter 523, and an OR gate 524. The voltage-controlled oscillators 521 and 522 have a wider variable range of output frequency than that of commonly used voltage-controlled oscillators.

The voltage-controlled oscillator 521 includes a received signal input terminal 521a, a control signal input terminal 521b, an identification signal input terminal 521c and an output terminal 521d. The burst signal input to the burst signal input terminal T1 is input to the received signal input terminal 521a; a control voltage from the PLL circuit 530, which will be described later, is input to the control signal input terminal 521b; the identification signal input to the bit rate identification signal input terminal T3 is input to the identification signal input terminal 521c; and an oscillation clock output from the output terminal 521d is input to one input terminal 534a of the OR gate 524.

The voltage-controlled oscillator 522 includes a received signal input terminal 522a, a control signal input terminal 522b, an identification signal input terminal 522c and an output terminal 522d. A signal resulting from inverting the burst signal input to the burst signal input terminal T1 by the inverter 523 is input to the received signal input terminal 522a; the control voltage from the PLL circuit 530, which will be described later, is input to the control signal input terminal 522b; the identification signal input to the bit rate identification signal input terminal T3 is input to the identification signal input terminal 522c; and an oscillation clock output from the output terminal 522d is input to another input terminal 534b of the OR gate 524.

The OR gate 524 obtains the logical sum of the output signals from the voltage-controlled oscillators 521 and 522.

The PLL circuit 530 includes a voltage-controlled oscillator 531, a phase comparator 532 and a control-voltage generation circuit 533.

The voltage-controlled oscillator 531 has substantially the same configuration and characteristics as those of the above-described voltage-controlled oscillators 521 and 522; including a received signal input terminal 531a, a control signal input terminal 531b, an identification signal input terminal 531c and an output terminal 531d. The received signal input terminal 531a has a constant voltage +V input thereto and is constantly pulled up to "H". A control voltage output from the control-voltage generation circuit 533 is input to the control signal input terminal 531b; a constant voltage Vs to select a specific range of oscillation frequency is input to the identification signal input terminal 531c; and an oscillation clock output from the output terminal 531d is input to the phase comparator 532.

The phase comparator 532 compares phases between the reference clock from the reference clock source 510 and an output clock signal from the voltage-controlled oscillator 531; and outputs a resulting comparison signal. The control-voltage generation circuit 533 provides to the voltage-controlled oscillators 521, 522 and 531 a control voltage based on the output signal from the phase comparator 532.

Next, an operation of the timing extraction circuit 500 will be described.

The PLL circuit 530, in a while after turning on the power, has a phase of the reference clock output by the reference clock source 510 in synchronization with a phase of the clock output by the voltage-controlled oscillator 531 which is continuously oscillating; and outputs from the control-voltage generation circuit 533 a control voltage at this time. This control voltage is also input to the control signal input terminals 521b and 522b of the voltage-controlled oscillators 521 and 522 in the clock generation circuit 520.

If the voltage-controlled oscillators 521 and 522 are in the state where they can oscillate, they perform oscillation in their respective frequency based on the control voltage input to the control signal input terminals 521b and 522b, within a specific frequency range corresponding to a bit rate identification signal I input to the identification signal input terminals 521c and 522c. The control voltage input to the voltage-controlled oscillators 521 and 522 is therefore stabilized to correspond to the reference clock, or in other words, to be prevented from fluctuating with the influence of external environment, by the PLL circuit 530. The adjustment signal ADJ is used as the bit rate identification signal I in the free running frequency adjustment of the gated-VCO based CDR.

Here, when a received signal is input to the clock generation circuit 520 by the burst signal input terminal T1, the signal would be directly input to one voltage-controlled oscillator 521; and the signal after being inverted by the inverter 523 would be input to the other voltage-controlled oscillator 522. Then, if the received signal is "H", the voltage-controlled oscillator 521 performs oscillation; and if the received signal is "L", the other voltage-controlled oscillator 522 performs oscillation.

The voltage-controlled oscillators 521 and 522 receive the bit rate identification signal I by their respective identification signal input terminals 521c and 522c; and their range of oscillation frequency is switched based on the bit rate identification signal I. Hence, the voltage-controlled oscillators 521 and 522 oscillate to output the clock at the frequency corresponding to the control voltage input to the control signal input terminals 521b and 522b, within the frequency range corresponding to the bit rate of the bit rate identification signal I.

At this time, each of the voltage-controlled oscillators 521 and 522 starts oscillating when the signal input to the corresponding one of the received signal input terminals 521a and 522a is changed from "L" to "H"; and then, since the output signal from the corresponding one of the output terminals 521d and 522d rises to "H", timing extraction (re-timing) which sets a clock phase back to an appropriate position, with a change of sign of an input signal, would be performed. Since this operation is complementary between the voltage-controlled oscillators 521 and 522, the output signal that appears in the output terminal T2 when the OR gate 524 obtains the logical sum would have a continuous clock in phase synchronization with the bit of the received signal.

Thus, as described above, in cases where the signals with a plurality of bit rates are time-multiplexed (time-division multiplexed) and are input, the frequency range is changed based on the bit rate identification signal I, every time the bit rate is changed. Then, with the control voltage, the frequency is adjusted to the frequency corresponding to the bit rate; and thus the continuous clock in phase synchronization with the bit of the received signal of this bit rate can be obtained.

3. Third Embodiment

Figure 17:
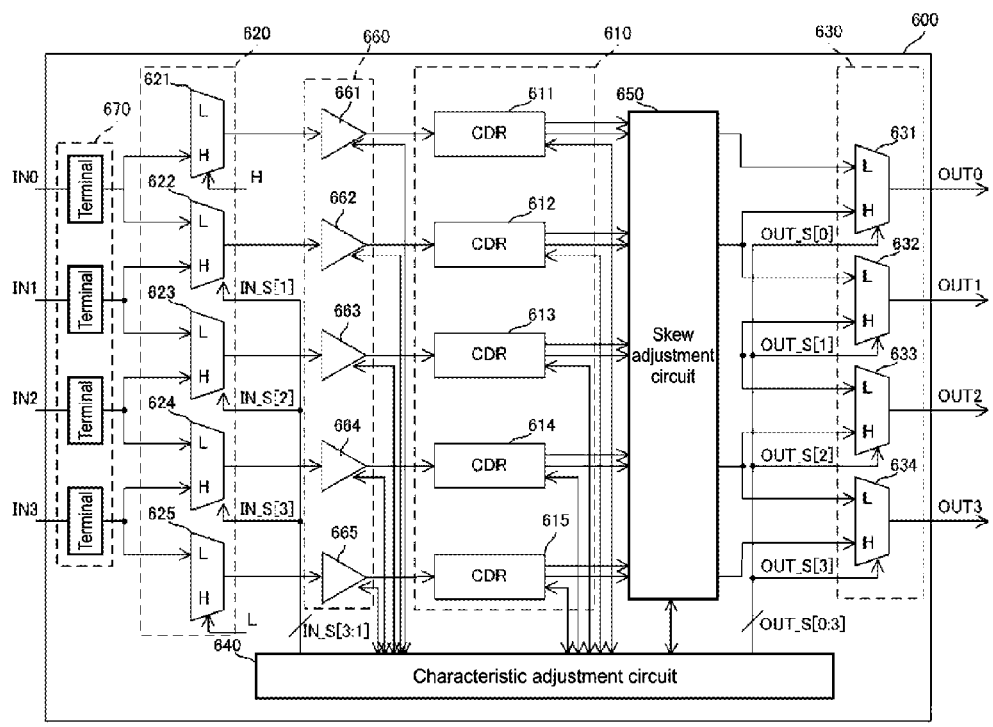
FIG. 17 is a block diagram showing a configuration of a circuit of a third embodiment of the present disclosure.

FIG. 17 shows an example of a configuration of a circuit 600 according to this embodiment. The circuit 600 shown in FIG. 17 is provided as an example of a receiver for high-speed serial transmission. The circuit 600 includes a clock data recovery circuit group 610, an input control circuit 620, an output control circuit 630, a characteristic adjustment circuit 640, a skew adjustment circuit 650, an equalizer group 660 and a reception terminal group 670. In this embodiment, the characteristic adjustment circuit 640 also functions as a control unit of the input control circuit 620, the output control circuit 630 and the skew adjustment circuit 650.

Note that the clock data recovery circuit group 610, the input control circuit 620, the output control circuit 630 and the skew adjustment circuit 650 of the circuit 600 of this embodiment are substantially the same as the above-described clock data recovery circuit group 210, the input control circuit 220, the output control circuit 230 and the skew adjustment circuit 250 of the circuit 200 of the second embodiment; so these will not be described in detail again.

The equalizer group 660 includes a plurality of equalizers 661 to 665, each equalizer being disposed in a corresponding transmission path between a selector and a CDR circuit. Accordingly, in this embodiment, a signal output from a selector would be input to a CDR via an equalizer.

Note that the equalizer is a component that adjusts frequency characteristics of received signals for the purpose of allowing recovery of waveforms of signals that have been distorted due to characteristics of the transmission path, or minimizing the distortion; and the equalizer may be a circuit that performs correction on signals by amplifying high-frequency side thereof, for the purpose of compensating for loss of high frequency components within the signals, which is to achieve an effect similar to that of passing a low-pass filter, the signals being sent by using the transmission path up to an upper limit of band thereof for high speed transmission.

The equalizers 661 to 665 in the equalizer group 660 are made redundant. That is, the CDR circuit group 660 has a larger number of equalizers than the number (required number) of equalizers required in the circuit 600. Accordingly, during operation of the circuit 600, at least one of the equalizers 661 to 665 of the equalizer group 660 would be in an unused state.

Note that the unused state of an equalizer means a state in which output of the equalizer is not used as output of the circuit 600; and a used state of an equalizer means a state in which output of the equalizer is used as output of the circuit 600.

In the example shown in FIG. 17, the circuit 600 has five equalizers 661 to 665, while the required number of the equalizers in the circuit 600 is four. The equalizer group 660 therefore has one more equalizer in addition to the required number of the equalizers. Accordingly, when the equalizers 661 to 664 are in the used state, the equalizer 665 is in the unused state. When the equalizers 661 to 663 and 665 are in the used state, the equalizer 664 is in the unused state. When the equalizers 661, 662, 664 and 665 are in the used state, the equalizer 663 is in the unused state. When the equalizers 661 and 663 to 665 are in the used state, the equalizer 662 is in the unused state. When the equalizers 662 to 665 are in the used state, the equalizer 661 is in the unused state.

The characteristic adjustment circuit 640 adjusts characteristics with respect to the equalizer which is thus regulated to the unused state. Examples of characteristic adjustment of the equalizer include frequency characteristic adjustment of the equalizer; offset voltage correction; and the like. These characteristics may fluctuate due to the changes in environment during operation, such as fluctuation of power supply voltage of LSI (Large Scale Integrated Circuit); temperature fluctuation in the LSI; and changes in the temperature of the transmission path to send signals from a transmitter to a receiver. These are the factors that may affect the operation margins. The characteristic adjustment circuit 640 holds reference data regarding the adjustment of these characteristics. It is therefore possible to continuously operate the circuit 600 without placing a time for characteristic adjustment of the circuit 600; by sequentially performing frequency characteristic adjustment of each equalizer and correction of offset voltages while running the operation of the circuit 600.

4. Fourth Embodiment

Figure 18:
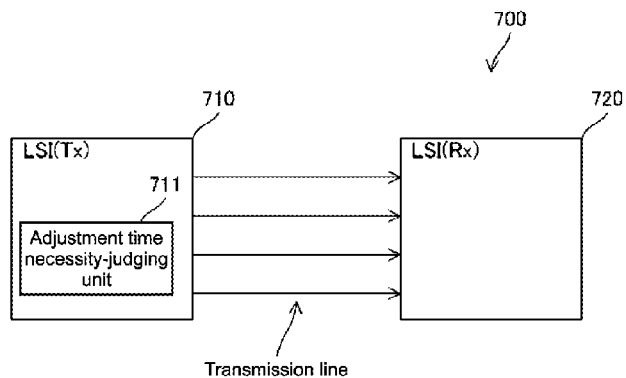
FIG. 18 shows a schematic configuration of a communication system of a fourth embodiment of the present disclosure.

FIG. 18 shows a schematic configuration of a communication system 700 of this embodiment. The communication system 700 shown in FIG. 18 includes a transmitting side LSI 710 which serves as a transmitting side circuit; and a receiving side LSI 720 which serves as a receiving side circuit. A signal output from the transmitting side LSI 710 is input to the receiving side LSI 720 via a transmission line.

The receiving side LSI 720 may have a configuration like those of the circuits of the above-described first to third embodiment, including a larger number of target circuits than a required number of target circuits, which may not need a time for adjustment. Otherwise, the receiving side LSI 720 may have a configuration as an existing one, which includes only the required number of target circuits and may need an adjustment time to adjust the target circuits after every predetermined time interval.

The transmitting side LSI 710 includes an adjustment time necessity-judging unit 711 which judges whether or not the adjustment time for the receiving side LSI 720 is needed. For example, the transmitting side LSI 710 may be provided with a register to store a piece of adjustment time necessity information which indicates whether or not the receiving side LSI 720 as a communication partner needs the adjustment time; and the adjustment time necessity-judging unit 711 may determine whether or not the receiving side LSI 720 needs the adjustment time, by referring to the register. The transmitting side LSI 710 may be configured to obtain the piece of adjustment time necessity information from the receiving side LSI 720 at the time of starting communication with the receiving side LSI 720, and stored it to the register. Alternatively, it may be configured to have the piece of adjustment time necessity information stored beforehand in the register.

Figure 19A:
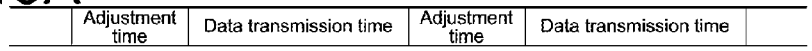
FIGS. 19A and 19B describe a communication of the communication system of the fourth embodiment.

In cases where the receiving side LSI 720 needs the adjustment time, as shown in FIG. 19A, the transmitting side LSI 710 periodically makes a pause for a predetermined time, in data transmission to the receiving side LSI 720, to wait for the receiving side LSI 720 to complete adjusting characteristics of the target circuit. The transmitting side LSI 710 would start the data transmission again after the receiving side LSI 720 completes adjustment of the characteristics of the target circuit. Accordingly, since the data transmission is performed intermittently with waiting times, the time for transmission is prolonged for these waiting times.

Figure 19B:

On the other hand, in cases where the receiving side LSI 720 does not need the adjustment time, as shown in FIG. 19B, the transmitting side LSI 710 is able to continuously perform the data transmission to the receiving side LSI 720. A communication speed between the transmitting side LSI 710 and the receiving side LSI 720 is therefore increased significantly as compared to that in the communication with the receiving side LSI 720 that needs the adjustment time.

Note that the present disclosure is not limited to the embodiments set forth herein; but encompasses configurations in which the features disclosed in the above-described embodiments are interchanged, configurations in which a combination of the features is altered, and the like. The technical scope of the present disclosure is not limited to the embodiments set forth herein, but it includes the scope of the attached claims, including a full range of equivalents to which each element thereof is entitled.

Furthermore, the present disclosure may employ, for example, configurations according to the following (a) to (m).

(a) An electric and electronic apparatus, including:
a plurality of target circuits, the number of the target circuits being more than a required number of the target circuits;
a characteristic adjustment circuit configured to adjust characteristics of the target circuits; and
a control unit configured to control a state of the target circuits between a used state and an unused state;
the control unit controlling the required number of the target circuits to be in the used state and controls the rest of the target circuits to be in the unused state,
the characteristic adjustment circuit adjusting the characteristics with respect to the target circuits in the unused state.

(b) The electric and electronic apparatus according to (a), in which
the control unit has an output control circuit configured to control output from the plurality of target circuits, and
the output control circuit outputs an output signal of the target circuits of the used state, but does not output an output signal of the target circuit of the unused state.

(c) The electric and electronic apparatus according to (a) or (b), in which
a number of input data input to the plurality of target circuits is the same number as the required number of the target circuits,
the control unit further has an input control circuit configured to control input to the plurality of target circuits,
the input control circuit inputs one of the input data to the target circuits of the used state, and inputs to the target circuit of the unused state the same input data as that input to one of the target circuits of the used state, and
the characteristic adjustment circuit adjusts the characteristics of the target circuit of the unused state by comparing the target circuit of the used state and the target circuit of the unused state to which the same input data are input.

(d) The electric and electronic apparatus according to any one of (a) to (c), in which
the control circuit controls the state of the target circuits between the used state and the unused state in such a manner that the plurality of target circuits evenly becomes in the unused state.

(e) The electric and electronic apparatus according to any one of (a) to (d), in which
the target circuits are clock data recovery circuits to output recovered data and a recovered clock, recovered from input data.

(f) The electric and electronic apparatus according to (e), in which
the characteristic adjustment circuit adjusts stationary phase error in the clock data recovery circuits.

(g) The electric and electronic apparatus according to (e) or (f), in which
the characteristic adjustment circuit adjusts a frequency sensitivity of a voltage-controlled oscillator included in the clock data recovery circuits.

(h) The electric and electronic apparatus according to any one of (e) to (g), in which
the characteristic adjustment circuit adjusts free running frequency of the clock data recovery circuits which are gated-voltage-controlled oscillator based clock data recovery circuits.

(i) The electric and electronic apparatus according to any one of (a) to (d), in which
input data are received data sent by high-speed serial transmission, and
the target circuits are equalizers to adjust frequency characteristics of the input data.

(j) The electric and electronic apparatus according to any one of (a) to (i), further including:
a skew adjustment circuit configured to adjust a skew between the recovered data and the recovered clock,
the characteristic adjustment circuit being configured to detect an amount of skew by comparing output data series of the clock data recovery circuit of the used state and output data series of the clock data recovery circuit of the unused state to which the same input data are input,
the skew adjustment circuit being configured to adjust the skew in such a manner that the amount of skew detected by the characteristic adjustment circuit is cancelled.

(k) A circuit including:
a plurality of target circuits, the number of the target circuits being more than a required number of the target circuits;
a characteristic adjustment circuit configured to adjust characteristics of the target circuits; and
a control unit configured to control a state of the target circuits between a used state and an unused state;
the control unit controlling the required number of the target circuits to be in the used state and controls the rest of the target circuits to be in the unused state,
the characteristic adjustment circuit adjusting the characteristics with respect to the target circuits in the unused state.

(l) A communication system including:
a transmitting side circuit; and
a receiving side circuit having
a plurality of target circuits, the number of the target circuits being more than a required number of the target circuits,
a characteristic adjustment unit configured to adjust characteristics of the target circuits, and
a control unit configured to control a state of the target circuits between a used state and an unused state,
the control unit controlling the required number of the target circuits to be in the used state and controls the rest of the target circuits to be in the unused state,
the characteristic adjustment circuit adjusting the characteristics with respect to the target circuits in the unused state.

(m) The communication system according to (L), in which the transmitting side circuit is configured to
transmit data continuously when communicating with the receiving side circuit without taking waiting times for adjustment, and
transmit data intermittently, taking the waiting times for adjustment, when communicating with a different receiving side circuit that is not provided with a function as in the receiving side circuit of adjusting characteristics with respect to the target circuits in the unused state.

What is claimed is:

1. An electric and electronic apparatus, comprising:
a plurality of target circuits, the number of the target circuits being more than a required number of the target circuits;
a characteristic adjustment circuit configured to adjust characteristics of the target circuits, control a state of the target circuits between an used state and an unused state, control the required number of the target circuits to be in the used state, control the rest of the target circuits to be in the unused state, and to adjust the characteristics with respect to the target circuits in the unused state.

2. The electric and electronic apparatus according to claim 1, further comprising:
an output control circuit configured to control output from the plurality of target circuits, wherein the output control circuit outputs an output signal of the target circuits of the used state, but does not output an output signal of the target circuit of the unused state.

3. The electric and electronic apparatus according to claim 1, wherein
a number of input data input to the plurality of target circuits is the same number as the required number of the target circuits,
an input control circuit configured to control input to the plurality of target circuits,
the input control circuit inputs one of the input data to the target circuits of the used state, and inputs to the target circuit of the unused state the same input data as that input to one of the target circuits of the used state, and
the characteristic adjustment circuit adjusts the characteristics of the target circuit of the unused state by comparing the target circuit of the used state and the target circuit of the unused state to which the same input data are input.

4. The electric and electronic apparatus according to claim 1, wherein
the characteristic adjustment circuit controls the state of the target circuits between the used state and the unused state in such a manner that the plurality of target circuits evenly becomes in the unused state.

5. The electric and electronic apparatus according to claim 1, wherein
the target circuits are clock data recovery circuits to output recovered data and a recovered clock, recovered from input data.

6. The electric and electronic apparatus according to claim 5, wherein
the characteristic adjustment circuit adjusts stationary phase error in the clock data recovery circuits.

7. The electric and electronic apparatus according to claim 5, wherein
the characteristic adjustment circuit adjusts a frequency sensitivity of a voltage-controlled oscillator included in the clock data recovery circuits.

8. The electric and electronic apparatus according to claim 5, wherein
the characteristic adjustment circuit adjusts free running frequency of the clock data recovery circuits which are gated-voltage-controlled oscillator based clock data recovery circuits.

9. The electric and electronic apparatus according to claim 1, wherein
input data are received data sent by high-speed serial transmission, and
the target circuits are equalizers to adjust frequency characteristics of the input data.

10. The electric and electronic apparatus according to claim 1, further comprising:
a skew adjustment circuit configured to adjust a skew between the recovered data and the recovered clock,
the characteristic adjustment circuit being configured to detect an amount of skew by comparing output data series of the clock data recovery circuit of the used state and output data series of the clock data recovery circuit of the unused state to which the same input data are input,
the skew adjustment circuit being configured to adjust the skew in such a manner that the amount of skew detected by the characteristic adjustment circuit is cancelled.

11. A circuit comprising:
a plurality of target circuits, the number of the target circuits being more than a required number of the target circuits;
a characteristic adjustment circuit configured to adjust characteristics of the target circuits, control a state of the target circuits between a used state and an unused state, control the required number of the target circuits to be in the used state, control the rest of the target circuits to be in the unused state, and adjust the characteristics with respect to the target circuits in the unused state.

12. The circuit according to claim 11, further comprising:
an output control circuit configured to control output from the plurality of target circuits, wherein the output control circuit outputs an output signal of the target circuits of the used state, but does not output an output signal of the target circuit of the unused state.

13. The circuit according to claim 11, wherein
a number of input data input to the plurality of target circuits is the same number as the required number of the target circuits,
an input control circuit configured to control input to the plurality of target circuits,
the input control circuit inputs one of the input data to the target circuits of the used state, and inputs to the target circuit of the unused state the same input data as that input to one of the target circuits of the used state, and
the characteristic adjustment circuit adjusts the characteristics of the target circuit of the unused state by comparing the target circuit of the used state and the target circuit of the unused state to which the same input data are input.

14. The circuit according to claim 11, wherein
the characteristic adjustment circuit controls the state of the target circuits between the used state and the unused state in such a manner that the plurality of target circuits evenly becomes in the unused state.

15. The circuit according to claim 11, wherein
the target circuits are clock data recovery circuits to output recovered data and a recovered clock, recovered from input data.

16. The circuit according to claim 15, wherein
the characteristic adjustment circuit adjusts stationary phase error in the clock data recovery circuits.

17. The circuit according to claim 15, wherein
the characteristic adjustment circuit adjusts a frequency sensitivity of a voltage-controlled oscillator included in the clock data recovery circuits.

18. A communication system comprising:
a transmitting side circuit; and
a receiving side circuit having
a plurality of target circuits, the number of the target circuits being more than a required number of the target circuits,
a characteristic adjustment circuit configured to adjust characteristics of the target circuits, control a state of the target circuits between a used state and an unused state, control the required number of the target circuits to be in the used state, control the rest of the target circuits to be in the unused state, and adjust the characteristics with respect to the target circuits in the unused state.

19. The communication system according to claim 18, wherein
the transmitting side circuit is configured to
transmit data continuously when communicating with the receiving side circuit without taking waiting times for adjustment, and
transmit data intermittently, taking the waiting times for adjustment, when communicating with a different receiving side circuit that is not provided with a function as in the receiving side circuit of adjusting characteristics with respect to the target circuits in the unused state.

20. The communication system according to claim 18, wherein the receiving side circuit further comprises an output control circuit that is configured to control output from the plurality of target circuits, wherein the output control circuit outputs an output signal of the target circuits of the used state, but does not output an output signal of the target circuit of the unused state.

* * * * *